United States Patent
Yoshizawa

(10) Patent No.: US 7,837,807 B2
(45) Date of Patent: Nov. 23, 2010

(54) MAGNETIC CORE FOR CURRENT TRANSFORMER, CURRENT TRANSFORMER, AND WATT-HOUR METER

(75) Inventor: Yoshihito Yoshizawa, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 38 days.

(21) Appl. No.: 12/226,737

(22) PCT Filed: Mar. 19, 2007

(86) PCT No.: PCT/JP2007/055469
§ 371 (c)(1),
(2), (4) Date: Jan. 5, 2009

(87) PCT Pub. No.: WO2007/125690
PCT Pub. Date: Nov. 8, 2007

(65) Prior Publication Data
US 2009/0184705 A1    Jul. 23, 2009

(30) Foreign Application Priority Data
Apr. 28, 2006   (JP) .............................. 2006-124980

(51) Int. Cl.
*H01F 1/00*    (2006.01)
*H01F 27/02*   (2006.01)
*H01F 38/20*   (2006.01)
*C09K 21/00*   (2006.01)

(52) U.S. Cl. .................. 148/312; 148/303; 148/304; 148/306; 148/313; 336/83; 336/173; 252/62.51 R; 252/62.59; 252/601

(58) Field of Classification Search .................. 336/83, 336/173, 180, 182; 252/62.51 R, 52.39, 252/601; 148/303, 304, 306, 313
See application file for complete search history.

(56) References Cited

U.S. PATENT DOCUMENTS 5,611,871 A * 3/1997 Yoshizawa et al. .......... 148/108
2002/0189718 A1* 12/2002 Yoshizawa .................. 148/313
2006/0000525 A1* 1/2006 Naoe et al. .................. 148/304

FOREIGN PATENT DOCUMENTS

| JP | 62067804 A | * | 3/1987 |
| JP | 64-079342 A |  | 3/1989 |
| JP | 01-235213 |  | 9/1989 |
| JP | 01-242755 |  | 9/1989 |
| JP | 04-4393 B |  | 1/1992 |
| JP | 05-203679 |  | 8/1993 |
| JP | 05-311321 |  | 11/1993 |
| JP | 11-186020 |  | 7/1999 |
| JP | 2001-052933 |  | 2/2001 |
| JP | 2001-155946 |  | 6/2001 |
| JP | 2002-530854 |  | 9/2002 |
| JP | 2006-045660 |  | 2/2006 |
| WO | WO 00/30132 |  | 5/2000 |
| WO | WO 03-085150 |  | 10/2003 |
| WO | WO 2006-064920 |  | 6/2006 |

* cited by examiner

*Primary Examiner*—Elvin G Enad
*Assistant Examiner*—Tszfung Chan
(74) *Attorney, Agent, or Firm*—Paul F. Neils, Esq.; Akerman Senterfitt LLP

(57) ABSTRACT

A magnetic core for a current transformer, and a current transformer and a watt hour meter used thereof, which is preferred the detection of a alternate current with a large asymmetrical waveform and a alternate current which a direct current is superimposed are realized. A magnetic core for a current transformer comprising the composition represented by the general formula: $Fe_{100-x-a-y-c}M_xCu_aM'_yX'_c$ (atomic %), wherein M is at least one element selected from Co and Ni, M' is at least one element selected from V, Ti, Zr, Nb, Mo, Hf, Ta, X' is at least one element selected from Si and B, and x, a, y, and c meets the composition of $3 \leq x \leq 50$, $0.1 \leq a \leq 3$, $1 \leq y \leq 10$, $2 \leq c \leq 30$, and also $7 \leq y+c \leq 30$, and an alloy comprising a crystal grain consisting of at least a part or all of the composition with a mean particle size of less than or equal to 50 nm.

10 Claims, 4 Drawing Sheets

MAGNETIC CORE FOR CURRENT TRANSFORMER, CURRENT TRANSFORMER, AND WATT-HOUR METER

CROSS-REFERENCE TO RELATED APPLICATIONS

The present invention is a 35 USC 371 national stage entry of PCT/JP2007/55469, filed Mar. 19, 2007, which claims priority from Japanese Patent Application No. 2006-124980, filed Apr. 28, 2006, the contents of all of which are herein incorporated by reference in their entirety.

FIELD OF THE INVENTION

The present invention relates to a magnetic core for current transformer, and a current transformer and a watt hour meter used thereof, which is preferable to detect an alternate current with an asymmetrical wave and an alternate current superimposed a direct current.

BACKGROUND OF THE INVENTION

Description of the Related Art

The current sensor with the current transformer (CT) and the hall element is used for the detection of alternate current. The purpose of using the current sensor is a current detection of a short circuit breaker, a watt hour meter, an inverter, or the like.

Although a watt hour meter with a rotary table is currently predominant in Japan, the distorted current cannot be detected by this method and the electric power cannot be accurately counted. Therefore, the specification with regard to a wattmeter is due to be changed into IEC1036 which is the specification adapted for the distorted waveform (half-wave rectification waveform). In connection with this, the watt hour meter of the present rotary table method is abolished, and a watt hour meter used a current transformer (CT) or a hall element for current detection is applied. Also, in the purpose of an inverter or the like, the current sensor has an important role for a detection of an alternate current with a distorted waveform and an alternate current superimposed a direct current.

The current sensor with a hall element performs a current detection by forming a gap in a magnetic core and arranging a hall element in a gap part, penetrating the lead flowing a measuring electric current in a closed magnetic circuit of magnetic core, and detecting a magnetic field which is almost proportional to the current generated in the gap part by the hall element. A current transformer (CT) generally uses by winding a secondary coil having comparatively many turns in one closed magnetic circuit of a magnetic core and by penetrating a primary line (line flowing electric current for measuring) in the closed magnetic circuit. The composition of a current transformer (CT) type current sensor is shown in FIG. 1. Although the shape of a magnetic core has a ring type and a coupled core type, the method winding to the ring type tape wound core can realize performance close to the theoretical operation since the shape can be miniaturized and the magnetic flux leakage can be reduced.

The output current i in the perfect case that a penetration current $I_0$ is an alternate current and a condition of $R_L \ll 2\pi f \cdot L_2$, $i=I_0/n$ (Formula 1), where n: the number of secondary coil, and the output voltage $E_0$ is $E_0=I_0 \cdot R_L/n$ (Formula 2), where R: load resistance. Actually, in response to the influence of the loss of magnetic core material, magnetic flux leakage, or the like, the output voltage $E_0$ declines rather than an ideal value. Although the sensitivity of a current transformer is equivalent to $E_0/I_0$, this value is actually determined by a primary and secondary combination coefficient. When a combination coefficient is set to K, it is $E_0=I_0 \cdot R_L \cdot K/n$ (Formula 3), where K: combination coefficient. In a perfect current transformer, although the combination coefficient K is set to 1, it is about the value K=0.95-0.99 in an actual current transformer by the influence of the internal resistance of winding, the exciting current required to load resistance, the magnetic flux leakage, the non-linearity of the magnetic permeability, or the like. When $R_L$ is less than or equal to 100Ω, a value almost of this level is shown. Since the value of K is reduced when a gap is in a magnetic path, a toroidal magnetic core without a gap can realize the perfect current transformer with the highest degree of bond. The K value approaches to 1 when the cross section S is larger, the number of secondary coil n is larger, and the load resistance $R_L$ is smaller. This K value is changed with the penetration current $I_0$, and especially if $I_0$ is a very small current of less than or equal to 100 mA since the K value shows the tendency to reduce, with a material with low magnetic permeability, when the very small current is measured with high precision, a magnetic core material with high magnetic permeability is used.

A ratio error shows the accuracy of a current value and is an error rate of an ideal value and an actual measurement value in each measurement point, and the combination coefficient characteristic is related to the ratio error. A phase difference shows the accuracy of waveform and is a phase gap of the output wave to a measurement original waveform. A current transformer output generally becomes a progress phase. These two characteristics are the especially important characteristics for the current transformer used for an integrating wattmeter or the like.

Therefore, in the current transformer which needs to measure the very small current, a material such as permalloy with high initial permeability is used for the current transformer in order to make a ratio error small by increasing the combination coefficient K and to make phase difference small. The maximum penetration current $I_{0max}$ of the current transformer is the maximum current from which linearity is obtained and is influenced by not only the load resistance or the internal resistance but also the magnetic property of the magnetic core material used for. In order to be able to measure a high current, it is preferable that the saturation flux density of magnetic core material is higher.

As a magnetic core material used for the current transformer, silicon steel, permalloy, amorphous alloy, Fe group nanocrystalline alloy material, and the like are known. Although the silicon steel plate is cheap material having high magnetic flux density, since the magnetic permeability is low, the hysteresis is large, and the change of the amplitude magnetic permeability is large to the magnetic field generated by the current, the ratio error and the phase difference are large and the value is also changed, there is a problem that the realization of the high precision current transformer is difficult. Since the residual flux density is large, the accurate current measurement is difficult to the asymmetrical current such as half-wave current.

Co group amorphous alloy shows the excellent characteristic as current transformer CT which detects the asymmetrical current since the change of amplitude magnetic permeability to the magnetic field is small and the hysteresis is also small. Co radical amorphous alloy with low magnetic permeability of about 1500 is also developed, and is used for CT for current detection having the direct current bias. However, since the saturation flux density of Co group amorphous alloy is less than or equal to 1 T, there is a problem that it is not sufficient to respond to measure the high current or to make the size small, and it is also thermally unstable. Therefore, when the large current is biased, there is a problem that the current measurement is restricted and the aspect of miniaturization or stability is not necessarily sufficient. Also, it is disadvantageous since Co, which is high cost, is included in large quantity.

On the other hand, since Fe group amorphous alloy has the large change to the magnetic field of amplitude magnetic permeability compared to Co group amorphous alloy, there is a problem that the change of the ratio error and the phase difference is large in the case of using as the current transformer, and it is difficult to perform the accurate current measurement to the asymmetrical current such as the half-wave current or the like because of the high magnetic permeability. As a detailed example of an alloy of Fe group amorphous alloy magnetic core for the current transformer, the alloy containing about 70-80 atomic % of Fe, up to about 20 atomic % of Fe substituted for Co, up to 3 atomic % of Fe substituted for Ni, Mn, V, Ti, or Mo, 13-30 atomic % of the element selected from a group of B, Si, or C is disclosed. However, since the heat treatment dependability of magnetic property is also large in the case of using for the tape wound core having a small diameter, to realize the stable characteristic is a difficult problem, and the mass productivity for the current transformer which is used in the integrating wattmeter for general home use remains an issue.

Fe group nanocrystalline alloy is used for the magnetic core of a common mode choke coil, a high frequency transformer, a pulse transformer, or the like since it shows the high magnetic permeability and the excellent soft magnetic characteristics. It is known that a typical composition system is a Fe—Cu—(Nb, Ti, Zr, Hf, Mo, W, Ta)—Si—B system alloy, a Fe—Cu—(Nb, Ti, Zr, Hf, Mo, W, Ta)—B system alloy, or the like described in Japanese Patent Publication No. H04-004393 or Japanese Patent Laid Open Publication No. H01-242755. These Fe group nanocrystalline alloy is produced by forming amorphous alloy by generally cooling rapidly from the liquid phase or the vapor phase and then microcrystallizing this by heat treatment. Fe group nanocrystalline alloy is obtained by microcrystallizing the amorphous alloy produced by these methods, and it is known that the excellent soft magnetic characteristics which is the high saturation flux density and the low magnetostriction comparable to Fe system amorphous alloy. It is described that Fe group nano crystal material is preferred for a current sensor (current transmission (current transformer)) in Patent document 1, Patent document 2, and Patent document 3, and it is described that it is suitable for a short circuit breaker, an integrating wattmeter, or the like.

Patent document 1: Japanese Patent Laid Open Publication No. H01-235213, (page 2, right upper column, line 16—left lower column, line 17, and FIG. 12).

Patent document 2: Japanese Patent Laid Open Publication No. H05-203679, ([0012]-[0013], and FIG. 1).

Patent document 3: Japanese Patent Publication (Translation of PCT Application) No. 2002-530854 ([0001], [0014]).

SUMMARY OF THE INVENTION

Problems to be Solved by the Invention

The disadvantage of the current sensor for watt hour meter with a hall element is included that the magnetic flux leakage is generated since there is a gap and may have an influence peripherally, the peripheral magnetic flux leakage is easy to have an influence conversely, the scope of measurable current with sufficient accuracy is narrow compared to the current transformer, and the sensitivity cannot be high, or the like. Also, in the current transformer, the same current transformer can be respond to the watt hour meter with a different specification since the scope of measurable current can be changed by altering the resistance used on the side of the secondary, it is disadvantageous in respect of the cut down including design manufacture since a hall element type is redesigned according to the scope of measurable current.

Although the magnetic core is conventionally used for materials such as a permalloy or the like with comparatively high magnetic permeability as a magnetic core for current transformer used for the integrating wattmeter or the like, the liberalization of electric power starts in recent years, and it is required to correctly measure the electric power in the case of not only conventional positive/negative symmetrical current and voltage waveform but also the asymmetrical current waveform and the distorted current waveform. Furthermore, when the direct current is overlapped by the purpose of use, it is also required to be able to correctly measure the alternate current. To such a requirement, the magnetic core for current transformer for detecting the current is necessary to be the magnetic core material with comparatively large anisotropy field Hk showing the low residual flux density, the small hysteresis, and the magnetization curve with sufficient linearity.

However, in the conventional magnetic core for current transformer, when the direct current is especially biased, there is a problem that the sufficient current detection cannot be performed by the saturation of the magnetic core. When making the current transformer respond to the state which is not positive/negative symmetrical current such as half-wave sinusoidal current and respond to the state which is biased, the current transformer is necessary to be able to detect the current in the state that the direct current is biased. Although the saturation flux density of the conventional Fe group amorphous soft magnetism alloy magnetic core is high, when using especially for the magnetic core with a small diameter and a high lamination factor, since the change to the magnetic field of amplitude permeability is large, there is a problem for the mass productivity of the current transformer used with the purpose that the direct current is biased. In a Fe—Co system amorphous alloy, although the B-H loop inclines by the increase in the amount of Co and the linearity of the B-H loop is not so sufficient, the preferred linearity of the B-H loop cannot be obtained unless the amount of Co is increased and the magnetic permeability is reduced to less than 800. However, in such a characteristic, since the magnetic permeability is too low and a phase angle and a ratio error becomes too large, there is a problem when using for a current transformer. Although it is known that Co group amorphous magnetism alloy magnetic core can apply for the purpose that the comparatively large direct current is biased, since the high saturation flux density is about 1 T and is restricted to increase $H_K$, there is a problem that the miniaturization or measuring current scope is not necessarily sufficient and a problem that it is thermally unstable.

In order to solve the above mentioned problem, the inventors of the present invention are invented a magnetic core consisting in an amorphous alloy having the excellent characteristic when using for the current transformer for current detection of the biased asymmetrical waveform and the direct current with a composition represented by the general formula: $Fe_{100-x-z}Ni_xX'_z$ (atomic %), where X' is at least one element selected from Si and B, x and z is the composition of $5 \leq x \leq 30$ and $14 \leq z \leq 30$, respectively, the magnetic flux density $B_{8000}$ in 8000 $Am^{-1}$ is more than 1.2 T and the anisotropy field $H_K$ is the range of 150 $Am^{-1}$ to 1200 $Am^{-1}$, the squareness ratio $B_r B_{8000}^{-1}$ is less than or equal to 5%, the alternate ratio initial magnetic permeability $\mu_r$ is more than 1000 and less than or equal to 4500 at 50 Hz and 0.05 $Am^{-1}$. Here, the anisotropy field $H_K$ is equivalent to the magnetic field relevant to the anisotropy of the B-H loop in the magnetization difficult axial direction of the magnetic core shown in FIG. 2.

In the alloy concerning of the present invention, Fe and Ni are essential elements. Fe has an effect in the improvement of magnetic flux density, and Ni has an effect in the reduction of squareness ratio, the adjustment of anisotropy field Hk, the adjustment of alternate ratio initial magnetic permeability and the reduction of the change of the amplitude magnetic permeability to the magnetic field generated by the current flowing in the conducting wire of the primary side. Since the plane roughness on the surface of an amorphous alloy is improved by containing Ni, it has also an effect in the improvement of lamination factor and hysteresis reduction. The contained amount x of Ni is needed to be $5 \leq x \leq 30$. It is not preferred when the contained amount x of Ni is less than 5 atomic %, the anisotropy is small, the anisotropy field Hk is small, and the change of amplitude ratio magnetic permeability is large. More preferable magnetic property is obtained when the contained amount x of Ni is more than 10 atomic %. It is not preferred when the contained amount x of Ni is more than 30 atomic %, the remarkable decline of magnetic flux density is caused. More preferable magnetic property is obtained when the contained amount x of Ni is less than or equal to 25 atomic %.

In the alloy in respect of the present invention, X' is at least one element selected from Si and B, and it has an effect of the amorphous formation. It is not preferred when the contained amount z of X' is less than 14 atomic % since the amorphous formation is difficult, and it is not preferred when the contained amount z of X' is more than 30 atomic % since the remarkable decline of the saturation flux density and the remarkable embrittlement of an alloy are caused.

The magnetic core of the present invention can be easily obtained the property of a $\mu_{ra100}/\mu_{ra005}$ ratio of an alternate relative initial magnetic permeability $\mu ra100$ of the amorphous alloy at 50 Hz and 100 $Am^{-1}$ to an alternate relative initial magnetic permeability $\mu_{ra005}$ in the range of $0.85 \leq \mu_{ra100}/\mu_{ra005} \leq 1.15$, and when using for the current transformer, it is preferred for the magnetic core for the current transformer because of making the change of a phase angle and a ratio error to primary current small.

In the magnetic core of the present invention, when an amorphous alloy comprises the contained amount of B in the range of more than 8 atomic % and less than or equal to 25 atomic %, the preferable result is obtained since the crystal formation is resistant to generate when the production of broad amorphous alloy ribbon and the dispersion in a current transformer is small. Also, when an alloy comprises the contained amount of Si in the range of more than 0.5 atomic % and less than or equal to 17 atomic %, the more preferable result is obtained since it has an effect of the improvement of thermal stability and the improvement of the corrosion resistance, and a more preferable result is obtained.

In the alloy of the present invention, at least one element selected from Cr, Mn, V, Ti, Zr, Nb, Hf, Ta, Mo, W, Co, Cu, Sn, Zn, In, Ag, Au, Sc, a platinoid element, Mg, Ca, Sr, Ba, Y, a rare earth element, N, O, and S which can be substituted for less than or equal to 5 atomic % of Fe. Substituting for these elements, the corrosion resistance can be improved, the magnetic property such as anisotropy and magnetostriction can be controlled, and the characteristic can be controlled according to the improvement in reliability of the current transformer and the purpose of use.

In the alloy of the present invention, at least one element selected from C, Ge, Ga, Al, Be, and P which can be substituted for less than or equal to 5 atomic % of X'. By substituting for these elements, the amorphous organization potency can be improved, the magnetic property such as anisotropy and magnetostriction can be controlled, and the dispersion reduction of the current transformer can be contributed.

When especially the outer diameter of magnetic core is less than or equal to 32 mm and a lamination factor is more than 75%, the more preferable result is obtained comparing to the conventional Fe group amorphous magnetic core for the current transformer, since the change of the amplitude magnetic permeability to the magnetic field generated by the current flowing in the conductive wire of the primary side can be made small and the change of the phase angle and the ratio error to the primary current as a current transformer can be made small.

The magnetic core for current transformer of the present invention is produced by cooling the alloy melting of the above mentioned composition by the rapidly cooling method such as the single roll method and then produced the amorphous alloy ribbon, performing the slit processing if necessary, winding in ring shape and processing into tape wound core shape, and performing the heat treatment by rise of temperature. Although it is more preferable that the amorphous alloy ribbon before the heat treatment is not included a crystalline phase, it may also include a crystalline phase partly. Although the rapidly cooling method such as the single roll method can be performed in the atmosphere when the active metals are not included, it can be performed in the inert gas such as Ar, He, or the like, or under reduced pressure when the active metals are included. Also, it may be produced in the atmosphere containing nitrogen gas, carbon monoxide gas, or carbon dioxide gas. It is preferable that the surface roughness of the alloy ribbon is smaller, and it is preferable that the surface roughness Ra is less than or equal to 5 μm. Especially, less than or equal to 2 μm is more preferable.

The heat treatment is generally performed in an inert gas such as argon gas, nitrogen gas, helium gas, or the like, or in a vacuum. The heat treatment in the magnetic field is performed by impressing the magnetic field having sufficient strength for saturating the alloys for at least a part of term of the heat treatment and the induced magnetic anisotropy is given. The magnetic field to impress is impressed in the crosswise direction of the ribbon (the height direction of the tape wound core), and the magnetic field strength is more than 8 $kAm^{-1}$, which is the strength that the magnetic core is magnetically saturated. The magnetic field to impress may be used any of the direct current, the alternate current, or the repetitive pulsed magnetic field. As the magnetic field to impress, any of the direct current, the alternate current, or the repetitive pulsed magnetic field may be used. By generally impressing the magnetic field at more than 200° C. temperature range for more than 20 minutes and also impressing in heating temperature, maintaining the constant temperature, and cooling temperature, the current transformer that the squareness ratio also becomes smaller, the linearity of the B-H loop is improved and the phase angle and the ratio error is smaller can be realized. When the squareness ratio $B_r B_{8000}^{-1}$ controls to less than or equal to 5%, the preferable result can also be obtained in application. Especially, when the squareness ratio $B_r B_{8000}^{-1}$ is less than or equal to 3%, the more preferable characteristic as the current transformer for integrating wattmeter is obtained. Here, $B_{8000}$ is the magnetic flux density in the case of impressing the magnetic field of 8000 Am$^{-1}$. On the other hand, when performing the heat treatment in the non-magnetic field and not applying the heat treatment in magnetic field, the performance as the current transformer deteriorates remarkably. It is preferable that the heat treatment is performed in the atmosphere of the inert gas which has the general dew point at less than or equal to −30° C., and it is more preferable that the heat treatment is performed in the atmosphere of the inert gas which has the dew point at less than or equal to −60° C. since the preferable result that the dispersion is small can be obtained. The highest achieving temperature in the case of the heat treatment is less than crystallization temperature, and the range is generally 250° C. to 500° C. In the case of the heat treatment pattern of maintaining the constant temperature, from a viewpoint of mass productivity, the maintaining time in the constant temperature is less than or equal 24 hours and preferably less than or equal to 4 hours. The heat treatment temperature to maintain is more preferably in the range of 300° C. to 450° C. In the case of the heat treatment, the average heating temperature rate is preferably from 0.1° C./min to 100° C./min and more preferably from 0.1° C./min to 50° C./min, and the average cooling rate is preferably from 0.1° C./min to 50° C./min and more preferably from 0.1° C./min to 10° C./min, and the current transformer that the B-H loop that the especially favorable linearity is obtained in this scope and the phase difference is small and the change of the ratio error is small is realized. The heat treatment can also be performed multiple steps of heat treatment and many times of heat treatment. When the size of a magnetic core is large or when the large amount of magnetic core is performed by the heat treatment, the more preferable result can be obtained by heating the temperature rate at a slow speed. When the magnetic core size is large, this is because there is a possibility that the characteristic is deteriorate since the temperature of the magnetic core becomes uneven and the stress is locally generated by the expansion difference when a heating rate is too rapidly, or the sufficient characteristic cannot be obtained since the difference in heat treatment of each part of the alloy magnetic core is generated. Furthermore, the heat treatment can be performed by flowing the direct current, the alternate current, or the pulsed current through the alloy and the alloy is heat generated.

The magnetic core for current transformer of the present invention is generally used by inserting into the insulating core case when it is used. This is for preventing the characteristic degradation by the stress generated in the magnetic core, there is the case lubricating grease between the case and the magnetic core or sandwiching the soft felt or the like.

The alloy concerning the magnetic core for current transformer of the present invention is coated the surface of the alloy ribbon by the powder or the membrane of $SiO_2$, MgO, $Al_2O_3$, or the like if necessary, is formed the insulating layer by surface treatment with chemical conversion treatment, is formed the oxide insulating layer on the surface by anodic oxidation treatment and performed inter-level isolation or the like, then the preferable result is obtained since the accurate current measurement can be performed in the case of the current measurement including the high frequency component. Although it is also possible to perform impregnation, coating, or the like if necessary when producing the magnetic core of the present invention, in order to prevent the characteristic degradation, it becomes the state that the stress is not applied by inserting the magnetic core in the case such as phenol resin or the like and winding the detection coil in the case of using for the current transformer. The magnetic core of the present invention shows the best performance as the magnetic core for the current transformer that the direct current is biased. It is preferred for the purpose of the current transformer for the integrating wattmeter corresponding to IEC1036 which is the specification adapted for the distortion waveform.

Another present invention is a current transformer having the above mentioned magnetic core for the current transformer and the detection coil. The current transformer comprising the magnetic core of the present invention can be performed the accurate current measurement that the correction is easy since the phase difference and the ratio error are small in the current measurement of the half-wave waveform, in the case of being biased the direct current, or the like. The current transformer of the present invention may be used to attach the resistance to the detection coil according to the current specification to measure. The current transformer of the present invention may be used to mold by resin with each detection coil. The current transformer of the present invention can be realized the property at 23° C., within 5° of the phase difference in the range of amperage rating, and within 1% of the absolute value of the ratio error by selecting the core size and the detection coil appropriately.

The current transformer of the present invention can be realized the property at 23° C., within 5° of the phase difference in the condition that ⅓ of the direct current of the amperage measurement is biased, and within 1% of the absolute value of the ratio error especially when the direct current is superimposed. Furthermore, the temperature characteristics of the current transformer is superior to that of the current transformer which uses a conventional permalloy and a Co group amorphous alloy. If the circuit correcting the error is used, the measurement accuracy can be further improved. Since the watt hour meter comprising the current transformer of the present invention can also correspond to IEC1036 which is the specification adapted for the distortion waveform (half-wave rectification waveform), even when the electric power measurement of the distorted current waveform is needed in the case that the deregulation of power industry progressed in the future, a highly accurate watt hour meter can be realized.

Effect of the Invention

According to the present invention, since the magnetic core for current transformer, and the current transformer and the watt hour meter used thereof, which is preferable to detect the alternate current with an asymmetrical wave and the alternate current superimposed the direct current can be realized, the effect is remarkable.

DESCRIPTION OF THE PREFERRED EMBODIMENTS

The present invention is explained according to the following embodiments, but the present invention is not limited to these.

Embodiment 1

The alloy melting of $Fe_{82-x}Ni_xSi_2B_{16}$ (atomic %) was rapidly cooled by the single roll method, and the amorphous alloy ribbon with 5 mm in width and 22 μm in thickness was obtained. This amorphous alloy ribbon was wound 30 mm in the outer diameter and 21 mm in the internal diameter and the toroidal magnetic core was produced.

The produced magnetic core was inserted in the furnace for heat treatment in the atmosphere of nitrogen gas, and the heat treatment in magnetic field was performed. The magnetic field of 280 kAm$^{-1}$ was impressed in the magnetic path of the alloy magnetic core and the perpendicular direction (the cross direction of the alloy ribbon), that is, the height direction of the magnetic core at the time of heat treatment. As a result of the X-ray diffraction, the alloy before and after heat treatment was not observed the crystal peak and was confirmed the amorphous single phase.

Then, the magnetic flux density $B_{8000}$, the squareness ratio $B_r B_{8000}^{-1}$, the coercive force $H_c$, the relative permeability $\mu_r$, and the anisotropy field $H_k$ in 8000 Am$^{-1}$ of this Fe$_{82-x}$Ni$_x$Si$_2$B$_{16}$ (atomic %) alloy magnetic core were measured. Also, the alternate ratio initial magnetic permeability $\mu_{ra100}$ at 50 Hz and 100 Am$^{-1}$, and the alternate ratio initial magnetic permeability $\mu_{ra005}$ at 50 Hz and 0.05 Am$^{-1}$ was measured, and the ratio $\mu_{ra100}/\mu_{ra005}$ was calculated. The magnetic flux density $B_{8000}$ at 8000 Am$^{-1}$ of Fe$_{82-x}$Ni$_x$Si$_2$B$_{16}$ (atomic %) alloy magnetic core is shown in FIG. 3; the squareness ratio $B_r B_{8000}^{-1}$ is shown in FIG. 4; the alternate ratio initial magnetic permeability $\mu_r$ at 50 Hz and 0.05 Am$^{-1}$ is shown in FIG. 5; the anisotropy field $H_k$ is shown in FIG. 6; the ratio $\mu_{ra100}/\mu_{ra005}$ of the alternate ratio initial magnetic permeability $\mu_{ra100}$ at 50 Hz and 100 Am$^{-1}$, and the alternate ratio initial magnetic permeability $\mu_{ra005}$ at 50 Hz and 0.05 Am$^{-1}$ is shown in FIG. 7. $B_{8000}$ of the magnetic core of the present invention shows the comparatively high value more than 1.1 T up to 30 atomic % in the amount x of Ni. The squareness ratio $B_r B_{8000}^{-1}$ shows the low value less than or equal to 5% in the range of more than 5 atomic % to less than or equal to 30 atomic % in the amount x of Ni. The alternate ratio initial magnetic permeability $\mu_r$ at 50 Hz and 0.05 Am$^{-1}$ decreases with the increase in the amount x of Ni. Although $\mu_{ra100}/\mu_{ra005}$ is less than 0.85 up to 5 atomic % in the amount x of Ni and the magnetic permeability change to the magnetic field is large, it shows greater than 0.85 and less than or equal to 1.15 at more than 5 atomic % in the amount x of Ni and the magnetic permeability change to the magnetic field is small. Therefore, in the case of applying the magnetic core of the current transformer, it is understood preferably that the correction is easy since the phase angle and the ratio error to measuring electric current is changed monotonously.

When x exceeds 30 atomic %, $\mu_r$ becomes less than 1000. On the other hand, the anisotropy field $H_k$ increases with the increase in the amount x of Ni. It shows the value of more than 150 A/m at more than 5 atomic % in the amount x of Ni and 1500 A/m at 50 atomic %. Also, it shows the value of more than 500 A/m at more than 15 atomic % in the amount x of Ni.

Then, by using the magnetic core of x=10 atomic %, the detection coil of 2500 turns is performed, the current 50 Hz and 30 A is passed to the primary lead in the state without load resistance, and the phase difference and the ratio error is measured at 23° C. Furthermore, the result of the confirming the possibility of the current measurement by superimposing the 5 A direct current is shown in Table 1. The magnetic core of the present invention shows the excellent characteristics of the current transformer that the phase difference is less than or equal to 4° and the absolute value of the ratio error is less than or equal to 1%, which is small, the current measurement is possible when the direct current is superimposed. Also, when the amount x of Ni exceeds 30%, the predominancy is lost to Co group amorphous alloy since the magnetic flux density is reduced and the magnetic permeability also becomes low.

TABLE 1

| Ni amount x (atomic %) | 0 | 3 | 5 | 10 | 15 | 20 | 25 | 30 |
|---|---|---|---|---|---|---|---|---|
| Possibility of measurement | x | x | ○ | ○ | ○ | ○ | ○ | ○ |

○: Measurable
x: Unmeasurable

Embodiment 2

The alloy melting of the composition shown in Table 2 was rapidly cooled with the single roll method in Ar atmosphere, and the amorphous alloy ribbon with 5 mm in thickness and 23 μm in width was obtained. The magnetic core of the present invention was produced by winding this amorphous alloy ribbon in the outer diameter of 22 mm and the internal diameter of 18 mm. The similar heat treatment as Embodiment 1 to this alloy magnetic core was performed, and then the magnetic measurement was performed. The alloy after the heat treatment was confirmed in the amorphous state as the result of the X-ray diffraction. Fe group amorphous alloy magnetic core in addition to the present invention was also evaluated for comparison. Then, the current transformer was produced by using this magnetic core, and the phase difference of amperage rating and the absolute value of the ratio error at 23° C. was measured. The magnetic flux density $B_{8000}$, the squareness ratio $B_r B_{8000}^{-1}$, the relative permeability $\mu_r$, the anisotropy field $H_k$, and the phase difference of the amperage rating and the absolute value of the ratio error is shown in Table 2. Also, the maximum value shows the suitableness of the half-wave sinusoidal current measurement in 25 A. The magnetic core of the present invention can be used as the current transformer since the phase difference and the absolute value of the ratio error is small and it is usable especially in the case that the direct current is biased, the current transformer can be used in the wide range of fields such as the current transformer for the integrating wattmeter and for the industrial current transformer.

TABLE 2

|  | No. | Composition (atomic %) | $B_{8000}$ (T) | $B_r B_{8000}^{-1}$ (%) | $\mu_r$ | $H_g$ (A m$^{-1}$) | Ratio Error RE (%) | Phase contrast θ (°) | Possibility of measurement |
|---|---|---|---|---|---|---|---|---|---|
| Example of the present invention | 1 | Fe$_{bal.}$Ni$_{10}$B$_{16}$Si$_3$ | 1.63 | 1 | 2500 | 520 | 0.38 | 1.67 | ○ |
| | 2 | Fe$_{bal.}$Ni$_{10}$B$_{11}$Si$_3$ | 1.57 | 0.8 | 2700 | 460 | 0.25 | 1.30 | ○ |
| | 3 | Fe$_{bal.}$Ni$_{10}$B$_{16}$Si$_2$C$_{0.6}$ | 1.64 | 0.5 | 2600 | 505 | 0.29 | 1.48 | ○ |
| | 4 | Fe$_{bal.}$Ni$_{10}$B$_{16}$Si$_2$Cr$_{0.5}$ | 1.61 | 0.7 | 2700 | 470 | 0.26 | 1.33 | ○ |
| | 5 | Fe$_{bal.}$Ni$_{10}$B$_{16}$Si$_2$Sn$_{0.5}$ | 1.63 | 0.7 | 2600 | 560 | 0.30 | 1.24 | ○ |
| | 6 | Fe$_{bal.}$Ni$_{10}$B$_{16}$Si$_2$Zn$_{0.5}$ | 1.63 | 0.5 | 2500 | 520 | 0.39 | 1.66 | ○ |
| | 7 | Fe$_{bal.}$Ni$_{10}$B$_{16}$Si$_2$In$_{0.5}$Nb$_{0.5}$ | 1.60 | 0.8 | 2600 | 490 | 0.29 | 1.48 | ○ |
| | 8 | Fe$_{bal.}$Ni$_{10}$B$_{16}$Si$_2$Ag$_{0.1}$ | 1.62 | 0.9 | 2500 | 510 | 0.39 | 1.67 | ○ |
| | 9 | Fe$_{bal.}$Ni$_{10}$B$_{16}$Si$_2$Au$_{0.4}$ | 1.62 | 0.8 | 2600 | 500 | 0.29 | 1.22 | ○ |

TABLE 2-continued

|  | No. | Composition (atomic %) | $B_{8000}$ (T) | $B_r B_{8000}^{-1}$ (%) | $\mu_r$ | $H_g$ (A m$^{-1}$) | Ratio Error RE (%) | Phase contrast $\theta$ (°) | Possibility of measurement |
|---|---|---|---|---|---|---|---|---|---|
|  | 10 | $Fe_{bal.}Ni_{10}B_{16}Si_2Sc_{0.4}$ | 1.62 | 0.9 | 2500 | 510 | 0.38 | 1.67 | o |
|  | 11 | $Fe_{bal.}Ni_{10}B_{16}Si_2Pt_{0.4}$ | 1.63 | 0.6 | 2600 | 500 | 0.29 | 1.23 | o |
|  | 12 | $Fe_{bal.}Ni_{10}B_{16}Si_2Mg_{0.001}$ | 1.63 | 0.7 | 2500 | 520 | 0.39 | 1.66 | o |
|  | 13 | $Fe_{bal.}Ni_{10}B_{16}Si_2Ca_{0.001}$ | 1.64 | 0.5 | 2500 | 520 | 0.39 | 1.68 | o |
|  | 14 | $Fe_{bal.}Ni_{10}B_{16}Si_2Sr_{0.001}$ | 1.63 | 0.5 | 2500 | 520 | 0.38 | 1.66 | o |
|  | 15 | $Fe_{bal.}Ni_{10}B_{16}Si_2Ba_{0.001}$ | 1.63 | 0.5 | 2500 | 510 | 0.40 | 1.68 | o |
|  | 16 | $Fe_{bal.}Ni_{10}B_{16}Si_2Y_{0.1}Hf_{0.1}$ | 1.61 | 0.6 | 2400 | 530 | 0.41 | 1.82 | o |
|  | 17 | $Fe_{bal.}Ni_{10}B_{16}Si_2Sm_{0.1}Zr_{0.1}$ | 1.62 | 0.8 | 2300 | 560 | 0.42 | 1.97 | o |
|  | 18 | $Fe_{bal.}Ni_{10}B_{16}Si_2Nd_{0.1}$ | 1.62 | 0.9 | 2300 | 560 | 0.43 | 1.96 | o |
|  | 19 | $Fe_{bal.}Ni_{10}B_{16}Si_2O_{0.001}$ | 1.62 | 0.8 | 2400 | 540 | 0.39 | 1.82 | o |
|  | 20 | $Fe_{bal.}Ni_{10}B_{16}Si_2N_{0.001}$ | 1.63 | 0.7 | 2400 | 550 | 0.38 | 1.83 | o |
|  | 21 | $Fe_{bal.}Ni_{10}B_{16}Si_2S_{0.01}$ | 1.63 | 0.8 | 2400 | 540 | 0.37 | 1.82 | o |
|  | 22 | $Fe_{bal.}Ni_{10}B_{16}Si_2A_1W_1$ | 1.55 | 0.5 | 2400 | 520 | 0.37 | 1.81 | o |
|  | 23 | $Fe_{bal.}Ni_{10}B_{16}Si_2Be_{0.5}$ | 1.63 | 0.5 | 2500 | 520 | 0.36 | 1.66 | o |
|  | 24 | $Fe_{bal.}Ni_{10}B_9Si_{14}Mn_{0.1}C_{0.5}$ | 1.62 | 0.7 | 2500 | 520 | 0.37 | 1.67 | o |
|  | 25 | $Fe_{bal.}Ni_{10}B_{16}Si_2V_{0.5}$ | 1.61 | 0.7 | 2600 | 500 | 0.30 | 1.51 | o |
|  | 26 | $Fe_{bal.}Ni_{10}B_{16}Si_2Mo_{0.5}$ | 1.60 | 0.8 | 2400 | 530 | 0.40 | 1.83 | o |
|  | 27 | $Fe_{bal.}Ni_{10}B_{16}Si_2Ti_{0.5}$ | 1.63 | 0.9 | 2300 | 570 | 0.44 | 1.94 | o |
|  | 28 | $Fe_{bal.}N_5Co_5B_{10}S_{15}Cu_{0.2}$ | 1.51 | 0.8 | 2300 | 580 | 0.44 | 1.96 | o |
|  | 29 | $Fe_{bal.}Ni_{10}Co_2B_{16}Si_2Mn_{0.5}$ | 1.60 | 0.7 | 2200 | 580 | 0.52 | 1.83 | o |
|  | 30 | $Fe_{bal.}Ni_{25}B_{16}Si_2Ga_{0.5}$ | 1.36 | 0.6 | 1100 | 980 | 0.90 | 4.81 | o |
|  | 31 | $Fe_{bal.}Ni_{20}B_{16}Si_2Ge_{0.5}$ | 1.45 | 0.7 | 1200 | 750 | 0.80 | 4.12 | o |
|  | 32 | $Fe_{bal.}Ni_{15}B_{16}Si_2P_{0.5}Ta_{0.5}$ | 1.59 | 0.8 | 1700 | 600 | 0.44 | 2.61 | o |
| Comparative | 33 | $Fe_{bal.}Co_{20}B_{16}Si_2$ | 1.79 | 0.4 | 790 | 1820 | 1.39 | 6.71 | Δ |
| example | 34 | Co-based Amorphous alloy | 1.02 | 0.6 | 1400 | 580 | 0.52 | 3.86 | o |
|  | 35 | Permalloy | 0.77 | 10 | 33000 | 17.8 | 0.15 | 0.21 | x | o: Measurable
Δ: Large error
x: Unmeasurable

Embodiment 3

The alloy melting of $Fe_{73.53}Ni_{10}B_{15.68}Si_{0.79}$ (atomic %) was rapidly cooled by the single roll method, and the amorphous alloy ribbon with 5 mm in thickness and 23 μm in width was obtained. The toroidal magnetic core was produced by winding this amorphous alloy ribbon in the outer diameter of 30 mm and the internal diameter of 15 mm. The produced magnetic core was inserted in the furnace for heat treatment in the atmosphere of the nitrogen gas, and the heat treatment in magnetic field was performed. The magnetic field of 280 kAm$^{-1}$ was impressed in the magnetic path of the alloy magnetic core, and the perpendicular direction (the cross direction of the alloy ribbon), that is, the height direction of the magnetic core at the time of heat treatment. The alloy after the heat treatment was not observed the crystal peak as the result of the X-ray diffraction and confirmed in the amorphous state. Then, the magnetic flux density $B_{8000}$ of this alloy in 8000 Am$^{-1}$, the squareness ratio $B_r B_{8000}^{-1}$, the coercive force $H_c$, the relative permeability $\mu_r$ in 50 Hz and 0.05 A/m, the anisotropy field $H_k$, the alternate ratio initial permeability $\mu_{ra100}$ in 50 Hz and 100 Am$^{-1}$, the alternate ratio initial permeability $\mu_{ra005}$ in 50 Hz and 0.05 Am$^{-1}$, and the ratio $\mu_{ra100}/\mu_{ra005}$ was calculated. $B_{8000}$ was 1.50 T, the squareness ratio $B_r B_{8000}^{-1}$ was 1%, the relative permeability $\mu_r$ in 50 Hz, and 0.05 A/m was 2200, the anisotropy field $H_k$ was 690 A/m, and $\mu_{ra100}/\mu_{ra005}$ was 0.95. Then, the detection coil of 2500 turns to this magnetic core was performed and the current transformer was produced. The ratio error and the absolute value of the phase difference in the amperage rating 30 A of the current transformer at 23° C. were 0.02% and 0.28%, respectively. Then, the integrating wattmeter was produced with the current transformer of the present invention. The electric power measurement can be performed not only to the alternate current on the sine wave with the symmetric positive/negative but also the half-wave waveform current.

Figure 1:
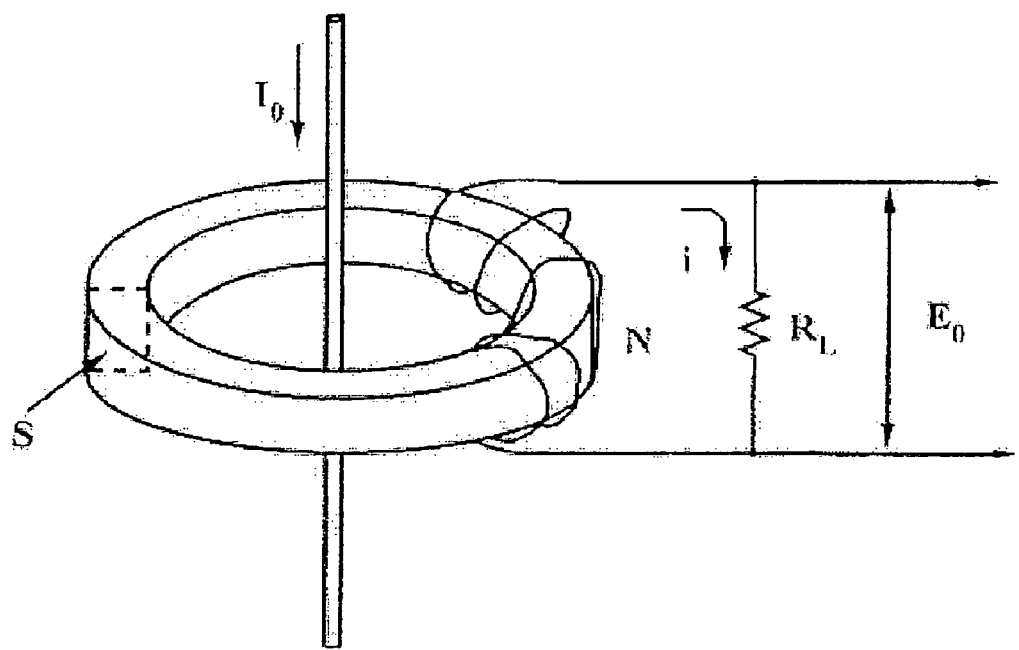
FIG. 1
It is a drawing showing an example of composition of the current transformer (CT) type current sensor concerning the present invention.
Figure 2:
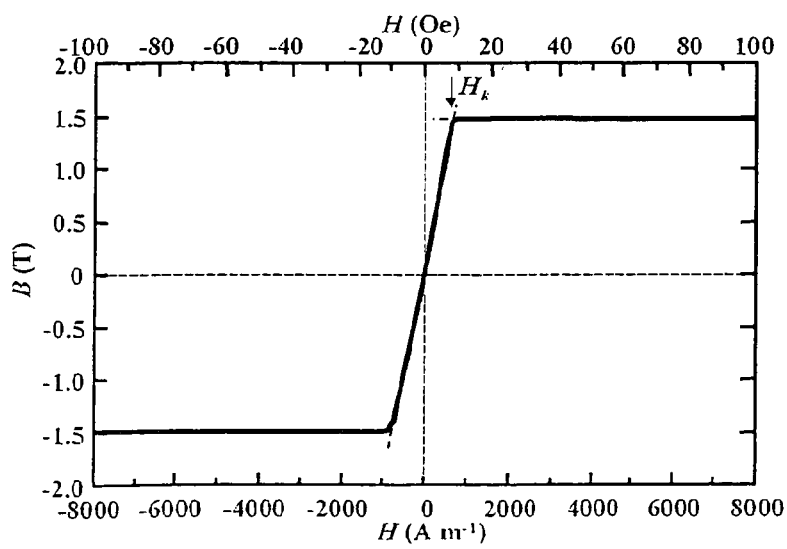
FIG. 2
It is a drawing showing an example of the B-H loop in the magnetization difficult axial direction of the magnetic core and the anisotropy field Hk concerning the present invention.
Figure 3:
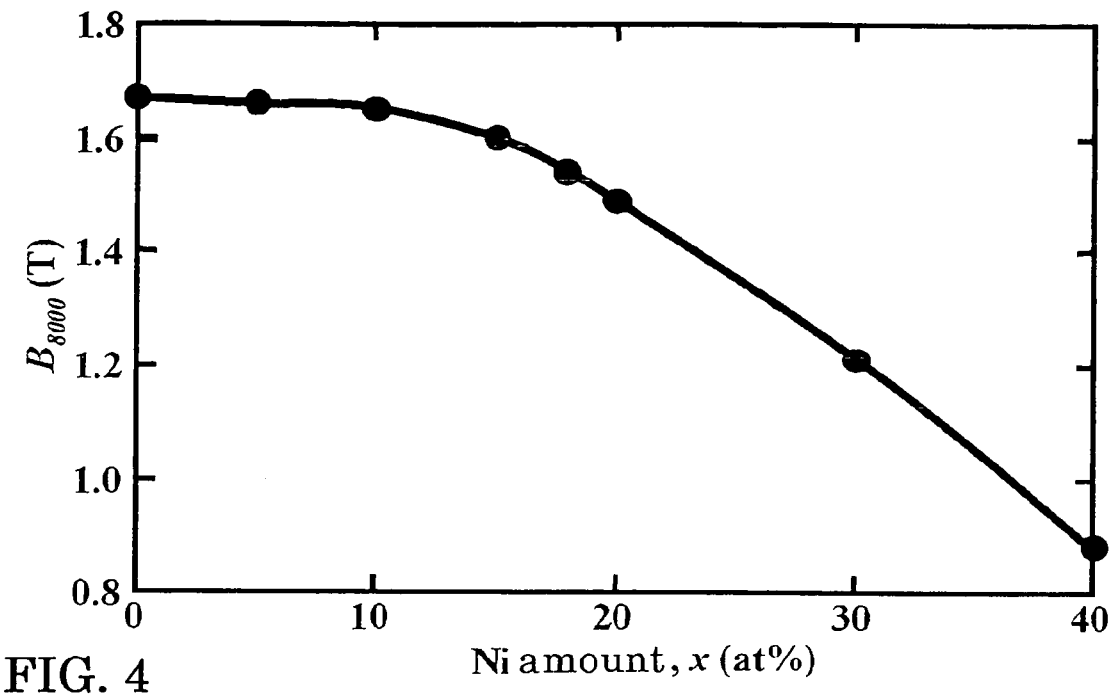
FIG. 3
It is a drawing showing the magnetic flux density $B_{8000}$ in 8000 Am$^{-1}$ of the alloy of $Fe_{82-x}Ni_xSi_2B_{16}$ (atomic %) concerning the magnetic core of the present invention.
Figure 4:
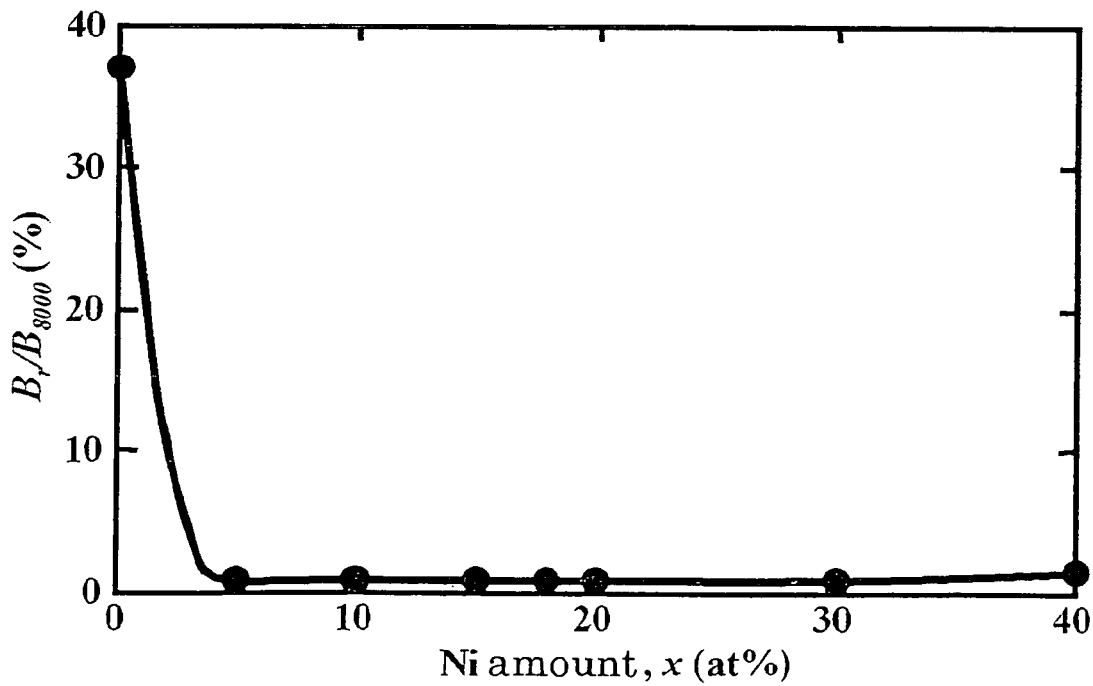
FIG. 4
It is a drawing showing the squareness ratio $B_r B_{8000}^{-1}$ of the alloy of $Fe_{82-x}Ni_xSi_2B_{16}$ (atomic %) concerning the magnetic core of the present invention.
Figure 5:
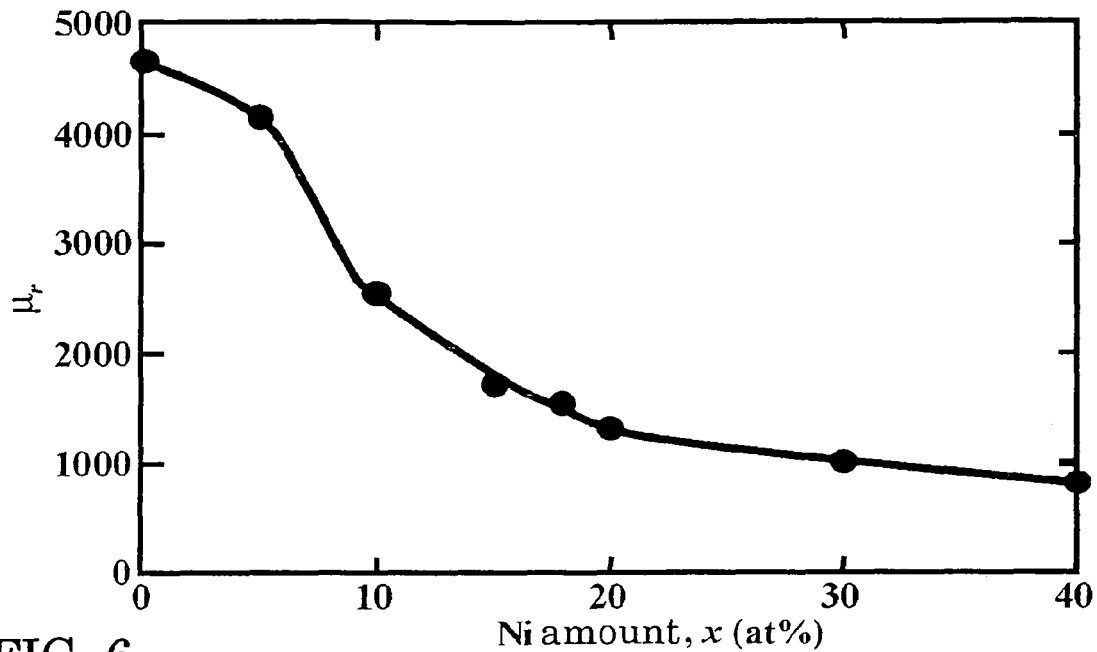
FIG. 5
It is a drawing showing alternate relative permeability $\mu_r$ in 50 Hz and 0.05 Am$^{-1}$ of the alloy of $Fe_{82-x}Ni_xSi_2B_{16}$ (atomic %) concerning the magnetic core of the present invention.
Figure 6:
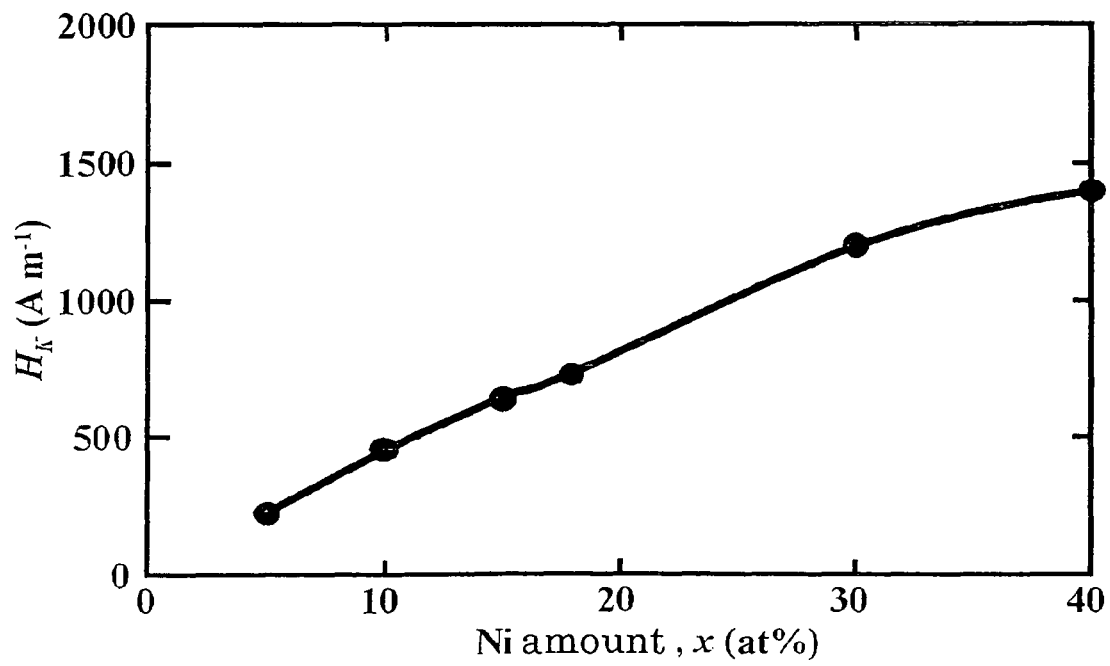
FIG. 6
It is a drawing showing the anisotropy field $H_k$ of the alloy of $Fe_{82-x}Ni_xSi_2B_{16}$ (atomic %) concerning the magnetic core of the present invention.
Figure 7:
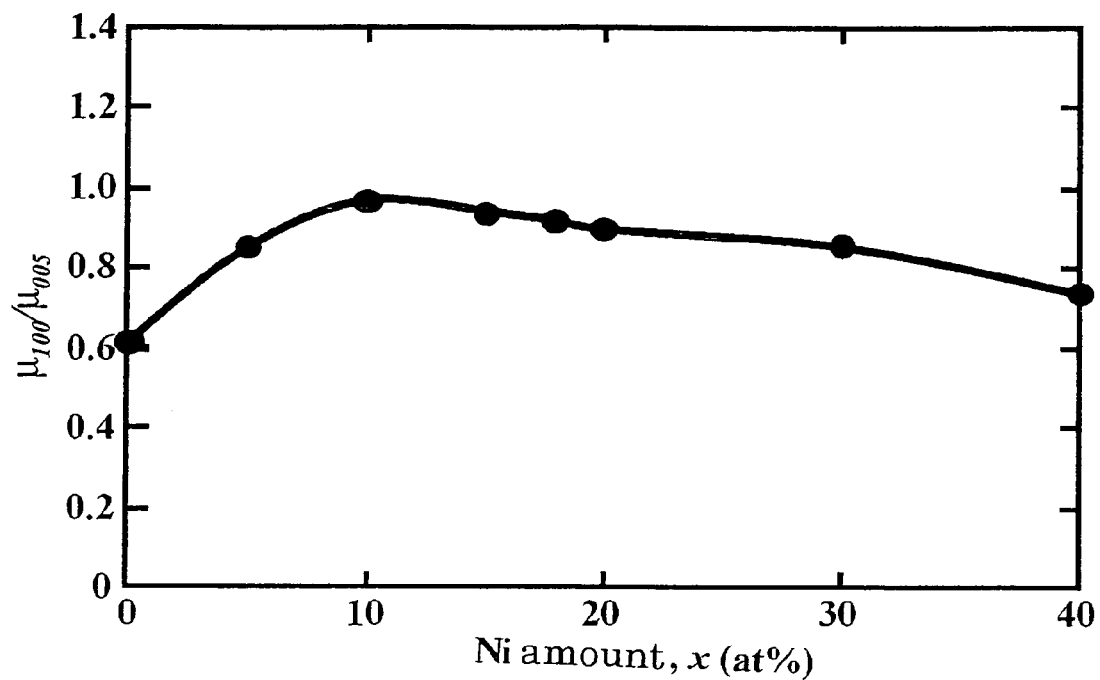
FIG. 7
It is a drawing showing the ratio $\mu_{ra100}/\mu_{ra005}$ of the alternate ratio initial permeability $\mu_{ra005}$ in 50 Hz and 0.05 Am$^{-1}$ to the alternate ratio initial permeability $\mu_{ra100}$ in 50 Hz and 100 Am$^{-1}$ of the alloy of $Fe_{82-x}Ni_xSi_2B_{16}$ (atomic %) concerning the magnetic core of the present invention.

What is claimed is:

1. A magnetic core for current transformer, which the composition is represented by the general formula:

$Fe_{100-x-z}Ni_xX'_z$ (atomic %), wherein X' is at least one element selected from Si and B, and x and z comprises an amorphous alloy which is the composition of $5 \leq x \leq 30$ and $14 \leq z \leq 30$, respectively, a magnetic flux density $B_{8000}$ in 8000 $Am^{-1}$ of said amorphous alloy is more than 1.2 T, an anisotropy field $H_K$ is in the range of more than 150 $Am^{-1}$ and less than or equal to 1200 $Am^{-1}$, a squareness ratio $B_rB_{8000}^{-1}$ is less than or equal to 5%, an alternate relative initial magnetic permeability $\mu_r$ is in the range of more than 1000 and less than or equal to 4500 at 50 Hz and 0.05 $Am^{-1}$, and a $\mu_{ra100}/\mu_{ra005}$ ratio of an alternate relative initial magnetic permeability $\mu_{ra100}$ of the amorphous alloy at 50 Hz and 100 $Am^{-1}$ to an alternate relative initial permeability $\mu_{ra005}$ is in the range of $0.85 \leq \mu_{ra100}/\mu_{ra005} \leq 1.15$.

2. The magnetic core for current transformer according to claim 1, wherein an amorphous alloy comprises the contained amount of B in the range of greater than or equal to 8 atomic % and less than or equal to 25 atomic %, and the sum of the amount of B and the amount of Si is in the range of greater than or equal to 14 atomic % and less than or equal to 30 atomic %.

3. The magnetic core for current transformer according to claim 1, wherein an alloy comprises the contained amount of Si in the range of greater than or equal to 0.5 atomic % and less than or equal to 17 atomic %, and the sum of the amount of B and the amount of Si is in the range of greater than or equal to 14 atomic % and less than or equal to 30 atomic %.

4. The magnetic core for current transformer according to claim 1, wherein an amorphous alloy comprises at least one element selected from Cr, Mn, V, Ti, Zr, Nb, Hf, Ta, Mo, W, Co, Cu, Sn, Zn, In, Ag, Au, Sc, a platinoid element, Mg, Ca, Sr, Ba, Y, a rare earth element, N, O, and S which is substituted for less than or equal to 5 atomic % of Fe.

5. The magnetic core for current transformer according to claim 1, wherein an amorphous alloy comprises at least one element selected from C, Ge, Ga, Al, Be, and P which is substituted for less than or equal to 5 atomic % of X'.

6. The magnetic core for current transformer according to claim 1, wherein an outer diameter is less than or equal to 32 mm and a lamination factor is more than 75%.

7. A current transformer comprising the magnetic core for current transformer according to claim 1 and detection coil.

8. The current transformer according to claim 7, wherein a phase difference is within 5° in the range of amperage rating and an absolute value of ratio error is less than or equal to 1% at 23° C.

9. The current transformer according to claim 7, wherein a phase difference is within 5° under the condition that ⅓ of the direct current of rated measuring electric current is biased and an absolute value of ratio error is less than or equal to 1% at 23° C.

10. A watt hour meter comprises the current transformer according to claim 7.

* * * * *